United States Patent
Miura et al.

(10) Patent No.: US 12,142,522 B2
(45) Date of Patent: Nov. 12, 2024

(54) METHOD FOR MANUFACTURING ELECTRONIC DEVICE

(71) Applicant: MITSUI CHEMICALS TOHCELLO, INC., Tokyo (JP)

(72) Inventors: Toru Miura, Nagoya (JP); Hiroyoshi Kurihara, Nagoya (JP)

(73) Assignee: MITSUI CHEMICALS TOHCELLO, INC., Tokyo (JP)

( * ) Notice: Subject to any disclaimer, the term of this patent is extended or adjusted under 35 U.S.C. 154(b) by 337 days.

(21) Appl. No.: 17/596,021

(22) PCT Filed: May 13, 2020

(86) PCT No.: PCT/JP2020/019120
§ 371 (c)(1),
(2) Date: Dec. 2, 2021

(87) PCT Pub. No.: WO2020/246207
PCT Pub. Date: Dec. 10, 2020

(65) Prior Publication Data
US 2022/0319918 A1   Oct. 6, 2022

(30) Foreign Application Priority Data
Jun. 3, 2019   (JP) .................. 2019-103469

(51) Int. Cl.
*H01L 21/768*   (2006.01)
*H01L 21/02*    (2006.01)
*H01L 21/263*   (2006.01)

(52) U.S. Cl.
CPC .. *H01L 21/76841* (2013.01); *H01L 21/02263* (2013.01); *H01L 21/2636* (2013.01)

(58) Field of Classification Search
None
See application file for complete search history.

(56) References Cited

U.S. PATENT DOCUMENTS 8,436,481 B2   5/2013  Hoshino et al.
11,034,864 B2  6/2021  Igarashi et al.
(Continued)

FOREIGN PATENT DOCUMENTS

CN   105981138 A   9/2016
CN   107750386 A   3/2018
(Continued)

OTHER PUBLICATIONS

Extended European Search Report issued May 31, 2023, by the European Patent Office in corresponding European Patent Application No. 20817947.3. (7 pages).
(Continued)

*Primary Examiner* — Alexander G Ghyka
(74) *Attorney, Agent, or Firm* — BUCHANAN, INGERSOLL & ROONEY PC

(57) ABSTRACT

A method for manufacturing an electronic device includes at least a step (1) of preparing a structure comprising (i) an adhesive film provided with a base material layer, an adhesive resin layer (A) provided on a first surface side of the base material layer, and an adhesive resin layer (B) provided on a second surface side of the base material layer, (ii) an electronic component attached to the adhesive resin layer (A) of the adhesive film, and (iii) a support substrate attached to the adhesive resin layer (B) of the adhesive film; a step (2) of sealing the electronic component with a sealing material; a step (3) of peeling the support substrate from the structure by reducing an adhesive force of the adhesive resin layer (B) by applying an external stimulus; and a step (4) of peeling the adhesive film from the electronic component.

4 Claims, 2 Drawing Sheets

(56) References Cited

U.S. PATENT DOCUMENTS

| | | |
|---|---|---|
| 2010/0167073 A1 | 7/2010 | Kitakatsu |
| 2011/0151625 A1 | 6/2011 | Hoshino et al. |
| 2018/0197764 A1 | 7/2018 | Kamada et al. |
| 2020/0048501 A1 | 2/2020 | Igarashi et al. |

FOREIGN PATENT DOCUMENTS

| | | |
|---|---|---|
| EP | 3442010 A1 | 2/2019 |
| JP | 2011134811 A | 7/2011 |
| JP | 2012062372 A | 3/2012 |
| JP | 2015-168711 A | 9/2015 |
| JP | 2016216597 A | 12/2016 |
| JP | 2018-157037 A | 10/2018 |
| TW | 201800527 A | 1/2018 |
| WO | 2007018120 A1 | 2/2007 |
| WO | 2018135546 A1 | 7/2018 |
| WO | 2019/031533 A1 | 2/2019 |

OTHER PUBLICATIONS

International Search Report (PCT/ISA/210) with an English translation, and Written Opinion (PCT/ISA/237) mailed on Jul. 28, 2020, by the Japanese Patent Office as the International Searching Authority for International Application No. PCT/JP2020/019120.

Office Action dated Jan. 19, 2024, by the Taiwan Intellectual Property Office in corresponding Taiwanese Patent Application No. 109116959, (9 pages).

(4)  (5)

(6)

METHOD FOR MANUFACTURING ELECTRONIC DEVICE

TECHNICAL FIELD

The present invention relates to a method for manufacturing an electronic device.

BACKGROUND ART

As a technology which is able to reduce the size and weight of electronic devices (for example, semiconductor apparatuses), a fan-out type WLP (wafer level package) is being developed.

In an eWLB (Embedded Wafer Level Ball Grid Array), which is one of the methods for manufacturing a fan-out type WLP, it is possible to adopt a method in which a plurality of electronic components such as semiconductor chips are temporarily fixed in a separated state on an adhesive film attached to a support substrate, and the plurality of electronic components are sealed in a batch with a sealing material. Here, the adhesive film needs to be fixed to the electronic component and the support substrate in the sealing step or the like and needs to be removed from the sealed electronic component and the support substrate after the sealing.

Examples of a technique related to such a fan-out type WLP manufacturing method include the technique described in Patent Document 1 (Japanese Patent Laid-Open No. 2011-134811).

Patent Document 1 discloses a heat-resistant adhesive sheet for manufacturing a semiconductor apparatus, which is used by being attached when resin-sealing a substrateless semiconductor chip, in which the heat-resistant adhesive sheet has a base material layer and an adhesive layer, and the adhesive layer has an adhesive force to SUS304 after bonding of 0.5 N/20 mm or more, is cured by a stimulus received until the completion of a resin sealing step, and has a peeling force with respect to a package of 2.0 N/20 mm or less.

RELATED DOCUMENT

Patent Document

[Patent Document 1] Japanese Patent Laid-Open No. 2011-134811

SUMMARY OF THE INVENTION

Technical Problem

According to studies by the inventors of the present invention, it was clear that, there are cases in which, when electronic components are arranged on an adhesive film and sealed with a sealing material, the positions of the electronic components shift (referred to below as position shifting of the electronic components), or, cases in which, when electronic components are arranged on an adhesive film attached to a support substrate, the electronic components are sealed with a sealing material, and then the electronic components are peeled from the adhesive film, a part of the adhesive resin layer of the adhesive film (also referred to below as "glue") remains on the electronic component side (also referred to below as "glue residue").

The present invention is made in consideration of the above circumstances and provides a method for manufacturing an electronic device with which it is possible to suppress position shifting of electronic components in a sealing step and suppress glue residue on the electronic component side when an electronic component is peeled from the adhesive film.

Solution to Problem

The inventors of the present invention carried out intensive studies in order to achieve the above object. As a result, it was found that, in an adhesive film provided with a base material layer, an adhesive resin layer (A) provided on a first surface side of the base material layer, and an adhesive resin layer (B) provided on a second surface side of the base material layer and in which an adhesive force is reduced by an external stimulus, measurement of a storage modulus E' at 125° C. of the adhesive resin layer (A) is effective as a design guideline for the adhesive film to suppress position shifting of electronic components and glue residue, thereby completing the present invention.

According to the present invention, a method for manufacturing an electronic device illustrated below is provided.

[1]
A method for manufacturing an electronic device, the method including at least:
  a step (1) of preparing a structure comprising
    an adhesive film provided with a base material layer, an adhesive resin layer (A) provided on a first surface side of the base material layer, and an adhesive resin layer (B) provided on a second surface side of the base material layer and in which an adhesive force is reduced by an external stimulus, in which a storage modulus E' at 125° C. of the adhesive resin layer (A) is $0.2 \times 10^6$ Pa or more and $4.5 \times 10^6$ Pa or less,
    an electronic component attached to the adhesive resin layer (A) of the adhesive film, and
    a support substrate attached to the adhesive resin layer (B) of the adhesive film;
  a step (2) of sealing the electronic component with a sealing material;
  a step (3) of peeling the support substrate from the structure by reducing an adhesive force of the adhesive resin layer (B) by applying an external stimulus; and
  a step (4) of peeling the adhesive film from the electronic component.

[2]
The method for manufacturing an electronic device according to [1], in which the adhesive resin layer (B) is an adhesive film in which an adhesive force is reduced by heating at a temperature exceeding 150° C., and the step (3) includes heating at a temperature exceeding 150° C.

[3]
The method for manufacturing an electronic device according to [1] or [2], in which the adhesive resin layer (B) includes at least one selected from gas generating components and thermally expandable microspheres.

[4]
The method for manufacturing an electronic device according to any one of [1] to [3], in which the adhesive resin layer (A) includes a (meth)acrylic-based adhesive resin.

[5]
The method for manufacturing an electronic device according to any one of [1] to [4], in which the sealing material is an epoxy resin-based sealing material.

Advantageous Effects of Invention

According to the present invention, it is possible to provide a method for manufacturing an electronic device with which it is possible to suppress position shifting of electronic components in a sealing step and to suppress glue residue on the electronic component side when peeling an electronic component from an adhesive film.

DESCRIPTION OF EMBODIMENTS

Figure 1:
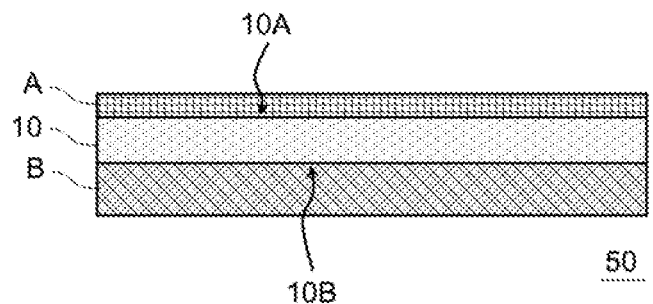
FIG. 1 is a cross-sectional view schematically showing an example of a structure of an adhesive film of an embodiment according to the present invention.

A description will be given below of embodiments of the present invention with reference to the drawings. In all the drawings, common reference numerals are given to the same constituent components and description thereof will not be repeated. In addition, the figures are schematic views and do not match the actual dimensional ratios. In addition, unless otherwise specified, "A to B" in the numerical range represents A or more and B or less. In addition, in the present embodiment, "(meth)acrylic" means acrylic, methacrylic, or both acrylic and methacrylic.

1. Adhesive Film

A description will be given below of an adhesive film 50 according to the present embodiment.

FIG. 1 is a cross-sectional view schematically showing an example of the structure of the adhesive film 50 of the embodiment according to the present invention.

As shown in FIG. 1, the adhesive film 50 according to the present embodiment is provided with a base material layer 10, an adhesive resin layer (A) provided on a first surface 10A side of the base material layer 10, and an adhesive resin layer (B) provided on a second surface 10B side of the base material layer 10 and in which an adhesive force is reduced by an external stimulus, in which a storage modulus E' at 125° C. of the adhesive resin layer (A) is $0.2 \times 10^6$ Pa or more and $4.5 \times 10^6$ Pa or less.

As described above, according to studies by the inventors of the present invention, it was clear that, in the methods for manufacturing an electronic device in the related art, the problems of position shifting of electronic components and glue residue may occur.

Therefore, the inventors of the present invention carried out intensive studies to realize a method for manufacturing an electronic device with which it is possible to suppress position shifting of electronic components in a sealing step and to suppress glue residue on the electronic component side when peeling an electronic component from an adhesive film. As a result, it was found for the first time that, in an adhesive film provided with the base material layer 10, the adhesive resin layer (A) provided on the first surface 10A side of the base material layer 10, and the adhesive resin layer (B) provided on the second surface 10B side of the base material layer 10 and in which an adhesive force is reduced by an external stimulus, setting the storage modulus E' at 125° C. of the adhesive resin layer (A) within the above range makes it possible to suppress position shifting of the electronic components in the sealing step and glue residue on the electronic component side when peeling an electronic component from the adhesive film.

That is, setting the storage modulus E' of the adhesive resin layer (A) at 125° C. to the range described above makes it possible for the adhesive film 50 according to the present embodiment to suppress position shifting of electronic components in a sealing step and to suppress glue residue on the electronic component side when peeling an electronic component from the adhesive film 50.

In the adhesive film 50 according to the present embodiment, the lower limit of the storage modulus E' at 125° C. of the adhesive resin layer (A) is $0.2 \times 10^6$ Pa or more, but is preferably $0.3 \times 10^6$ Pa or more, more preferably $0.5 \times 10^6$ Pa or more, and even more preferably $0.6 \times 10^6$ Pa or more, from the viewpoint of being able to further suppress glue residue on the electronic component side when the electronic component is peeled from the adhesive film 50.

In addition, in the adhesive film 50 according to the present embodiment, the upper limit of the storage modulus E' at 125° C. of the adhesive resin layer (A) is $4.5 \times 10^6$ Pa or less, but is preferably $4.0 \times 10^6$ Pa or less, more preferably $3.0 \times 10^6$ Pa or less, and even more preferably $2.5 \times 10^6$ Pa or less from the viewpoint of being able to further suppress position shifting of the electronic components in the sealing step.

It is possible to control the storage modulus E' at 125° C. of the adhesive resin layer (A) within the above range by controlling, for example, the type and blending ratio of each component forming the adhesive resin layer (A).

From the viewpoint of the balance between mechanical properties and handleability, the total thickness of the adhesive film 50 according to the present embodiment is preferably 10 μm or more and 1000 μm or less, and more preferably 20 μm or more and 500 μm or less.

In particular, it is possible to suitably use the method for manufacturing an electronic device according to the present embodiment in steps of manufacturing a fan-out type WLP.

Next, a description will be given of each layer forming the adhesive film 50 according to the present embodiment.

<Base Material Layer>

The base material layer 10 is a layer provided for the purpose of making the characteristics such as the handling, mechanical properties, heat resistance, and the like of the adhesive film 50 more favorable.

The base material layer 10 is not particularly limited and examples thereof include a resin film.

As the resin forming the resin film described above, it is possible to use a known thermoplastic resin. Examples thereof include one type or two or more types selected from polyolefins such as polyethylene, polypropylene, poly(4-methyl-1-pentene), and poly(l-butene); polyesters such as polyethylene terephthalate, polybutylene terephthalate, and polyethylene naphthalate; polyamides such as nylon-6, nylon-66, and polymetaxylene adipamide; polyacrylates; polymethacrylates; polyvinyl chlorides; polyvinylidene chlorides; polyimides; polyetherimides; ethylene vinyl acetate copolymers; polyacrylonitrile; polycarbonates; polystyrenes; ionomers; polysulfones; polyethersulfone; polyphenylene ether, and the like.

Among these, from the viewpoint of an excellent balance between the transparency, mechanical strength, price, and the like, one type or two or more types selected from polypropylene, polyethylene terephthalate, polyethylene naphthalate, polyamide, and polyimide are preferable, and at least one type selected from polyethylene terephthalate and polyethylene naphthalate is more preferable.

The base material layer 10 may be a single layer or a layer of two or more types.

In addition, the form of the resin film used to form the base material layer 10 may be a stretched film or a film stretched in the uniaxial or biaxial direction; however, from the viewpoint of improving the mechanical strength of the base material layer 10, a film stretched in the uniaxial or biaxial direction is preferable.

From the viewpoint of obtaining favorable film properties, the thickness of the base material layer 10 is preferably 1 μm or more and 500 μm or less, more preferably 5 μm or more and 300 μm or less, and even more preferably 10 μm or more and 250 μm or less.

The base material layer 10 may be subjected to a surface treatment in order to improve the adhesion with other layers. Specifically, a corona treatment, a plasma treatment, an undercoat treatment, a primer coat treatment, and the like may be performed.

<Adhesive Resin Layer (A)>

The adhesive resin layer (A) is a layer provided on one surface side of the base material layer 10 and is for contacting the surface of the electronic component to temporarily fix the electronic component when the electronic component is sealed with a sealing material in the electronic device manufacturing steps.

The adhesive resin layer (A) includes an adhesive resin (A1).

Examples of the adhesive resin (A1) include a (meth)acrylic-based adhesive resin (a), a silicone-based adhesive resin, a urethane-based adhesive resin, an olefin-based adhesive resin, a styrene-based adhesive resin, and the like.

Among the above, the (meth)acrylic-based adhesive resin (a) is preferable from the viewpoint of facilitating the adjustment of the storage modulus E' at 125° C. of the adhesive resin layer (A).

As the adhesive resin layer (A), it is also possible to use a radiation cross-linking adhesive resin layer in which the adhesive force is reduced by radiation. The radiation cross-linking adhesive resin layer is cross-linked by the irradiation of radiation and the adhesive force is significantly reduced, thus, the adhesive film 50 is easily peeled from the electronic component. Examples of the radiation include ultraviolet rays, electron beams, infrared rays, and the like.

As the radiation cross-linking adhesive resin layer, an ultraviolet cross-linking adhesive resin layer is preferable.

Examples of the (meth)acrylic-based adhesive resin (a) used in the adhesive resin layer (A) include a copolymer including a (meth)acrylic acid alkyl ester monomer unit (a1) and a monomer unit (a2) having a functional group capable of reacting with a cross-linking agent.

In the present embodiment, the (meth)acrylic acid alkyl ester means an acrylic acid alkyl ester, a methacrylic acid alkyl ester, or a mixture thereof.

It is possible to obtain the (meth)acrylic-based adhesive resin (a) according to the present embodiment, for example, by copolymerizing a monomer mixture including a (meth) acrylic acid alkyl ester monomer (a1) and a monomer (a2) having a functional group capable of reacting with a cross-linking agent.

Examples of the monomer (a1) forming the (meth)acrylic acid alkyl ester monomer unit (a1) include a (meth)acrylic acid alkyl ester having an alkyl group having approximately 1 to 12 carbon atoms. A (meth)acrylic acid alkyl ester having an alkyl group having 1 to 8 carbon atoms is preferable. Specific examples thereof include methyl acrylate, methyl methacrylate, ethyl acrylate, ethyl methacrylate, butyl acrylate, butyl methacrylate, 2-ethylhexyl acrylate, 2-ethylhexyl methacrylate, and the like. These may be used alone or in a combination of two or more types. In the (meth)acrylic-based adhesive resin (a) according to the present embodiment, when the total of all the monomer units in the (meth)acrylic-based adhesive resin (a) is 100% by mass, the content of the (meth)acrylic acid alkyl ester monomer unit (a1) is preferably 10% by mass or more and 98.9% by mass or less, more preferably 50% by mass or more and 97% by mass or less, and even more preferably 85% by mass or more and 95% by mass or less.

Examples of the monomer (a2) forming the monomer (a2) having a functional group capable of reacting with the cross-linking agent include acrylic acid, methacrylic acid, itaconic acid, mesaconic acid, citraconic acid, fumaric acid, maleic acid, itaconic acid monoalkyl ester, mesaconic acid monoalkyl ester, citraconic acid monoalkyl ester, fumaric acid monoalkyl ester, maleic acid monoalkyl ester, glycidyl acrylate, glycidyl methacrylate, 2-hydroxyethyl acrylate, 2-hydroxyethyl methacrylate, acrylamide, methacrylamide, tert-butylaminoethyl acrylate, tert-butylaminoethyl methacrylate, and the like. Preferable are acrylic acid, methacrylic acid, 2-hydroxyethyl acrylate, 2-hydroxyethyl methacrylate, acrylamide, methacrylamide, and the like. These may be used alone or in a combination of two or more types.

In the (meth)acrylic-based adhesive resin (a) according to the present embodiment, when the total of all the monomer units in the (meth)acrylic-based adhesive resin (a) is 100% by mass, the content of the monomer unit (a2) is preferably 1% by mass or more and 40% by mass or less, more preferably 1% by mass or more and 20% by mass or less, and even more preferably 1% by mass or more and 10% by mass or less.

The (meth)acrylic-based adhesive resin (a) according to the present embodiment may, in addition to the monomer unit (a1) and the monomer unit (a2), further include a bifunctional monomer unit (a3) and a specific comonomer (referred to below as a polymerizable surfactant) unit having properties as a surfactant.

The polymerizable surfactant has a property of copolymerizing with the monomer (a1), the monomer (a2), and the monomer (a3), and also has an action as an emulsifier in the case of emulsion polymerization.

Examples of the monomer (a3) forming the bifunctional monomer unit (a3) include allyl methacrylate, allyl acrylate, divinylbenzene, vinyl methacrylate, vinyl acrylate, trimethylolpropane tri(meth)acrylate, pentaerythritol tri(meth)acrylate, dipentaerythritol hexa(meth)acrylate, tetraethylene glycol di(meth)acrylate, or, for example, monomers in which the main chain structure is a propylene glycol type with diacrylate or dimethacrylate at both ends (for example, manufactured by NOF Corp., trade name: PDP-200, PDP-400, ADP-200, and ADP-400), tetramethylene glycol type monomers (for example, manufactured by NOF Corp., trade name: ADT-250 and ADT-850), mixtures thereof (for example, manufactured by NOF Corp., trade name: ADET-1800 and ADPT-4000), and the like.

In the (meth)acrylic-based adhesive resin (a) according to the present embodiment, when the total of all the monomer units in the (meth)acrylic-based adhesive resin (a) is 100% by mass, the content of the monomer unit (a3) is preferably 0.1% by mass or more and 30% by mass or less, more preferably 0.1% by mass or more and 15% by mass or less, even more preferably 0.1% by mass or more and 20% by mass or less, and particularly preferably 0.1% by mass or more and 5% by mass or less.

Examples of the polymerizable surfactant include a surfactant in which a polymerizable 1-propenyl group is introduced into a benzene ring of polyoxyethylene nonylphenyl ether (manufactured by Daiichi Kogyo Seiyaku Co., Ltd.;

trade name: Aqualon RN-10, RN-20, RN-30, RN-50, and the like), a surfactant in which a polymerizable 1-propenyl group is introduced into a benzene ring of ammonium salt of sulfuric acid ester of polyoxyethylene nonylphenyl ether (manufactured by Daiichi Kogyo Seiyaku Co., Ltd.; trade name: Aqualon HS-10, HS-20, HS-1025, and the like), and a sulfosuccinate diester-based surfactant having a polymerizable double bond in the molecule (manufactured by Kao Corp.; trade name: Latemul S-120A, S-180A, and the like), or the like.

In the (meth)acrylic-based adhesive resin (a) according to the present embodiment, when the total of all monomer units in the (meth)acrylic-based adhesive resin (a) is 100% by mass, the content of the polymerizable surfactant is preferably 0.1% by mass or more and 30% by mass or less, more preferably 0.1% by mass or more and 15% by mass or less, even more preferably 0.1% by mass or more and 20% by mass or less, and particularly preferably 0.1% by mass or more and 5% by mass or less.

The (meth)acrylic-based adhesive resin (a) according to the present embodiment may further contain a monomer unit formed of a monomer having a polymerizable double bond such as vinyl acetate, acrylonitrile, or styrene, as necessary.

Examples of the polymerization reaction mechanism of the (meth)acrylic-based adhesive resin (a) according to the present embodiment include radical polymerization, anionic polymerization, cationic polymerization, and the like. In consideration of the manufacturing cost of the (meth) acrylic-based adhesive resin, the influence of the functional group of the monomer, the influence of ions on the surface of the electronic component, and the like, it is preferable to carry out the polymerization by radical polymerization.

When polymerizing by a radical polymerization reaction, examples of radical polymerization initiators include organic peroxides such as benzoyl peroxide, di-t-butyl peroxide, dicumyl peroxide, 3,3,5-trimethylhexanoyl peroxide, di-2-ethylhexylperoxy dicarbonate, methyl ethyl ketone peroxide, t-butylperoxyphthalate, t-butylperoxybenzoate, di-t-butylperoxyacetate, t-butylperoxyisobutyrate, t-butylperoxy-2-hexanoate, t-butylperoxy-2-ethylhexanoate, t-butylperoxy-3,5,5-trimethylhexanoate, acetyl peroxide, isobutyryl peroxide, octanoyl peroxide, t-butyl peroxide, and di-t-amyl peroxide; inorganic peroxides such as ammonium persulfate, potassium persulfate, and sodium persulfate; and azo compounds such as 2,2'-azobisisobutyronitrile, 2,2'-azobis-2-methylbutyronitrile, and 4,4'-azobis-4-cyanovaleric acid.

In a case of polymerizing by an emulsion polymerization method, among these radical polymerization initiators, inorganic peroxides such as water-soluble ammonium persulfate, potassium persulfate, and sodium persulfate, and azo compounds having a carboxyl group in the molecule such as water-soluble 4,4'-azobis-4-cyanovaleric acid are preferable. Considering the influence of ions on the surface of the electronic components, ammonium persulfate and azo compounds having a carboxyl group in the molecule such as 4,4'-azobis-4-cyanovaleric acid are more preferable, and azo compounds having a carboxyl group in the molecule such as 4,4'-azobis-4-cyanovaleric acid are particularly preferable.

The adhesive resin layer (A) according to the present embodiment preferably further includes a cross-linking agent (A2) having two or more cross-linkable functional groups in one molecule, in addition to the adhesive resin (A1).

The cross-linking agent (A2) having two or more cross-linkable functional groups in one molecule is used to react with the functional group of the adhesive resin (A1) and adjust the storage modulus, adhesive force, and aggregating force.

Examples of such a cross-linking agent (A2) include epoxy-based compounds such as sorbitol polyglycidyl ether, polyglycerol polyglycidyl ether, pentaerythritol polyglycidyl ether, diglycerol polyglycidyl ether, glycerol polyglycidyl ether, neopentyl glycol diglycidyl ether, and resorcin diglycidyl ether; isocyanate-based compounds such as tetramethylene diisocyanate, hexamethylene diisocyanate, toluene diisocyanate 3 adduct of trimethylolpropane, polyisocyanate, diphenylmethane diisocyanate, and tolylene diisocyanate; aziridine-based compounds such as trimethylolpropane-tri-β-aziridinylpropionate, tetramethylolmethane-tri-β-aziridinylpropionate, N,N'-diphenylmethane-4,4'-bis(1-aziridinecarboxamide), N,N'-hexamethylene-1,6-bis(1-aziridinecarboxamide), N,N'-toluene-2,4-bis(1-aziridinecarboxamide), and trimethylolpropane-tri-β-(2-methylaziridine) propionate; tetrafunctional epoxy-based compounds such as N,N,N',N'-tetraglycidyl-m-xylenediamine and 1,3-bis(N,N'-diglycidylaminomethyl) cyclohexane; and melamine-based compounds such as hexamethoxymethylolmelamine. These may be used alone or in a combination of two or more types. Among the above, one type or two or more types selected from epoxy-based compounds, isocyanate-based compounds, and aziridine-based compounds are preferably included.

The total content of the cross-linking agent (A2) in the adhesive resin layer (A) is preferably 1.0 part by mass or more to 18.0 parts by mass or less with respect to 100 parts by mass of the adhesive resin (A1) and more preferably 2.0 parts by mass or more to 16.0 parts by mass or less, from the viewpoint of adjusting the storage modulus E' at 125° C. to a desired value.

The adhesive resin layer (A) may include additives such as plasticizers and adhesion-imparting resins as other components. In a case where the adhesive resin layer (A) is a radiation cross-linking adhesive resin, various additives for radiation cross-linking may be included. The total content of the adhesive resin (A1) and the cross-linking agent (A2) in the adhesive resin layer (A) is preferably 50% by mass or more when the entire adhesive resin layer (A) is 100% by mass, more preferably 70% by mass or more, even more preferably 90% by mass or more, and particularly preferably 95% by mass or more. Due to this, it is possible to further suppress glue residue on the electronic component side when the adhesive film is peeled from the electronic component.

The thickness of the adhesive resin layer (A) is not particularly limited, but is, for example, preferably 1 μm or more and 100 μm or less, and more preferably 3 μm or more and 50 μm or less.

It is possible to form the adhesive resin layer (A), for example, by coating an adhesive on the base material layer 10. The coating solution at this time is a coating solution dissolved in a solvent, an aqueous emulsion coating solution, or the like.

Among the above, an aqueous emulsion coating solution is preferable. Examples of aqueous emulsion coating solutions include a coating solution in which the (meth)acrylic-based adhesive resin (a), a silicone-based adhesive resin, a urethane-based adhesive resin, an olefin-based adhesive resin, a styrene-based adhesive resin, or the like is dispersed in water.

An adhesive coating solution dissolved in an organic solvent may be used. The organic solvent is not particularly limited and may be appropriately selected from known organic solvents in consideration of solubility and drying time. Examples of organic solvents include ester-based organic solvents such as ethyl acetate and methyl acetate; ketone-based organic solvents such as acetone and MEK; aromatic-based organic solvents such as benzene, toluene, and ethylbenzene; linear or cyclic aliphatic-based organic solvents such as heptane, hexane, and cyclohexane; and alcohol-based organic solvents such as isopropanol and butanol. Ethyl acetate and toluene are preferable as the organic solvent. These solvents may be used alone as one type or used in a mixture of two or more types. As a method for coating the adhesive coating solution, it is possible to adopt a coating method known in the related art, for example, a roll coater method, a reverse roll coater method, a gravure roll method, a bar coating method, a comma coater method, a die coater method, or the like. The drying conditions of the coated adhesive are not particularly limited, but in general, it is preferable to perform the drying in a temperature range of equal to or more than 80° C. and equal to or less than 200° C. for 10 seconds to 10 minutes. More preferably, drying is performed at equal to or more than 80° C. and equal to or less than 170° C. for 15 seconds to 5 minutes. In order to sufficiently promote the cross-linking reaction between the cross-linking agent and the adhesive, after the drying of the adhesive coating solution is completed, heating may be carried out at equal to or more than 40° C. and equal to or less than 80° C. for approximately 5 to 300 hours.

In addition, the base material layer 10 and the adhesive resin layer (A) may be formed by coextrusion molding, or the film-like base material layer 10 and the film-like adhesive resin layer (A) may be formed by laminating.

<Adhesive Resin Layer (B)>

The adhesive film 50 according to the present embodiment is provided with the adhesive resin layer (B) for which the adhesive force is reduced by an external stimulus, on the second surface 10B side on the opposite side to the first surface 10A of the base material layer 10.

Due to this, it is possible to easily peel the adhesive film 50 from the support substrate 80 by applying an external stimulus.

Here, examples of the adhesive resin layer (B), the adhesive force of which is reduced by an external stimulus, include a heat-peelable adhesive resin layer, the adhesive force of which is reduced by heating, a radiation-peelable adhesive resin layer, the adhesive force of which is reduced by radiation, and the like. Among the above, a heat-peelable adhesive resin layer, the adhesive force of which is reduced by heating, is preferable.

Examples of the heat-peelable adhesive resin layer include adhesive resin layers formed of a heat-expandable adhesive including a gas generating component, a heat-expandable adhesive including heat-expandable microspheres capable of expanding to reduce the adhesive force, an adhesive, the adhesive force of which is reduced by the cross-linking reaction of the adhesive components by heat, or the like.

In the present embodiment, the heat-expandable adhesive used in the adhesive resin layer (B) is an adhesive, the adhesive force of which is reduced or lost by heating at a temperature exceeding 150° C., for example. For example, it is possible to select a material which does not peel at a temperature of 150° C. or lower and which does peel at a temperature exceeding 150° C. and which preferably has an adhesive force such that the adhesive film 50 does not peel from the support substrate 80 during the electronic device manufacturing steps.

Here, it is possible to evaluate the reduction or loss of the adhesive force by heating at a temperature exceeding 150° C., for example, by the peeling strength from a stainless-steel plate, measured after attaching the adhesive resin layer (B) side to the stainless-steel plate, performing a heating treatment at 140° C. for one hour, and then heating at a temperature exceeding 150° C. for two minutes. The specific heating temperature when heating at a temperature exceeding 150° C. is set to a temperature higher than the temperature at which gas is generated or the temperature at which heat-expandable microspheres undergo heat expansion and is set as appropriate depending on the type of gas to be generated or the heat-expandable microspheres. In the present embodiment, loss of adhesive force means, for example, a case where the 180° peeling strength measured under conditions of 23° C. and a tensile speed of 300 ram/min is less than 0.5 N/25 mm.

As the gas generating component used in the heat-expandable adhesive, for example, it is possible to use an azo compound, an azide compound, a Meldrum's acid derivative, or the like. In addition, it is also possible to use inorganic foaming agents such as ammonium carbonate, ammonium hydrogen carbonate, sodium hydrogen carbonate, ammonium nitrite, sodium borohydride, and various azides, or water; salts of fluoroalkane-based compounds such as trichloromonofluoromethane and dichloromonofluoromethane; azo-based compounds such as azobisisobutyronitrile, azodicarbonamide, and barium azodicarboxylate; hydrazine-based compounds such as paratoluenesulfonyl hydrazide, diphenylsulfone-3,3'-disulfonylhydrazide, 4,4'-oxybis(benzenesulfonyl hydrazide) and allylbis(sulfonylhydrazide); semicarbazide-based compounds such as p-toluylenesulfonyl semicarbazide, and 4,4'-oxybis(benzenesulfonyl semicarbazide); triazole-based compounds such as 5-morpholyl-1,2,3,4-thiatriazole; organic foaming agents such as N-nitroso compounds such as N,N'-dinitrosopentamethylenetetramine, and N,N'-dimethyl-N,N'-dinitrosoterephthalamide, and the like. The gas generating component may be added to the adhesive resin (B1) or may be directly bonded to the adhesive resin (B1).

As the heat-expandable microspheres used for the heat-expandable adhesive, for example, it is possible to use a microencapsulated foaming agent. Examples of such heat-expandable microspheres include microspheres in which a substance that is easily gasified and expanded by heating such as isobutane, propane, and pentane is sealed in a shell having elasticity, or the like. Examples of the material forming the shell include vinylidene chloride-acrylonitrile copolymer, polyvinyl alcohol, polyvinyl butyral, polymethyl methacrylate, polyacrylonitrile, polyvinylidene chloride, polysulfone, and the like. It is possible to manufacture heat-expandable microspheres by, for example, a coacervation method, an interfacial polymerization method, or the like.

It is possible to add heat-expandable microspheres to the adhesive resin.

It is possible to appropriately set the content of at least one type selected from the gas generating component and the heat-expandable microspheres according to the expansion ratio and the reduction in adhesive force of the heat-peelable adhesive resin layer (B) and the like without being particularly limited; however, for example, with respect to 100 parts by mass of the adhesive resin (B1) in the heat-peelable adhesive resin layer (B), the content is, for instance, 1 part by mass or more and 150 parts by mass or less, preferably 10 parts by mass or more and 130 parts by mass or less, and more preferably 12 parts by mass or more and 100 parts by mass or less.

It is preferable to implement the design such that the temperature at which gas is generated or the temperature at which the heat-expandable microspheres heat-expand is exceeding 150° C.

Examples of the adhesive resin (B1) forming the heat-expandable adhesive include a (meth)acrylic-based resin (b), a urethane-based resin, a silicone-based resin, a polyolefin-based resin, a polyester-based resin, a polyamide-based resin, a fluorine-based resin, a styrene-diene block copolymer-based resin, and the like. Among these, the (meth)acrylic-based resin (b) is preferable.

Examples of the (meth)acrylic-based adhesive resin (b) used for the adhesive resin layer (B) include a copolymer including a (meth)acrylic acid alkyl ester monomer unit (b1) and a monomer unit (b2) having a functional group able to react with a cross-linking agent.

In the present embodiment, the (meth)acrylic acid alkyl ester means an acrylic acid alkyl ester, a methacrylic acid alkyl ester, or a mixture thereof.

It is possible to obtain the (meth)acrylic-based adhesive resin (b) according to the present embodiment, for example, by copolymerizing a monomer mixture including a (meth)acrylic acid alkyl ester monomer (b1) and a monomer (b2) having a functional group able to react with a cross-linking agent.

The monomer (b1) forming the (meth)acrylic acid alkyl ester monomer unit (b1) includes (meth)acrylic acid alkyl esters having an alkyl group of approximately 1 to 12 carbon atoms. A (meth)acrylic acid alkyl ester having an alkyl group having 1 to 8 carbon atoms is preferable. Specific examples thereof include methyl acrylate, methyl methacrylate, ethyl acrylate, ethyl methacrylate, butyl acrylate, butyl methacrylate, 2-ethylhexyl acrylate, 2-ethylhexyl methacrylate, and the like. These may be used alone or in a combination of two or more types. In the (meth)acrylic-based adhesive resin (b) according to the present embodiment, the content of the (meth)acrylic acid alkyl ester monomer unit (b1) is preferably 10% by mass or more and 98.9% by mass or less when the total of all monomer units in the (meth)acrylic-based adhesive resin (b) is 100% by mass, more preferably 50% by mass or more and 97% by mass or less, and even more preferably 85% by mass or more and 95% by mass or less.

Examples of the monomers (b2) forming the monomer (b2) having a functional group able to react with the cross-linking agent include acrylic acid, methacrylic acid, itaconic acid, mesaconic acid, citraconic acid, fumaric acid, maleic acid, itaconic acid monoalkyl ester, mesaconic acid monoalkyl ester, citraconic acid monoalkyl ester, fumaric acid monoalkyl ester, maleic acid monoalkyl ester, glycidyl acrylate, glycidyl methacrylate, acrylic acid-2-hydroxyethyl, methacrylic acid-2-hydroxyethyl acrylate, acrylamide, methacrylamide, tert-butylaminoethyl acrylate, tert-butylaminoethyl methacrylate, and the like. Acrylic acid, methacrylic acid, acrylic acid-2-hydroxyethyl, methacrylic acid-2-hydroxyethyl, acrylamide, methacrylamide, and the like are preferable. These may be used alone or in a combination of two or more types.

In the (meth)acrylic-based adhesive resin (b) according to the present embodiment, the content of the monomer unit (b2) is preferably 1% by mass or more and 40% by mass or less when the total of all monomer units in the (meth)acrylic-based adhesive resin (b) is 100% by mass, more preferably 1% by mass or more and 20% by mass or less, and even more preferably 1% by mass or more and 10% by mass or less.

The (meth)acrylic-based adhesive resin (b) according to the present embodiment may further include, in addition to the monomer unit (b1) and the monomer unit (b2), a bifunctional monomer unit (b3) and a specific comonomer (referred to below as a polymerizable surfactant) unit having properties as a surfactant.

The polymerizable surfactant has a property of copolymerizing with monomer (b1), monomer (b2), and monomer (b3) and also acts as an emulsifier in a case where emulsion polymerization is performed.

Examples of the monomers (b3) forming the bifunctional monomer units (b3) include allyl methacrylate, allyl acrylate, divinylbenzene, vinyl methacrylate, vinyl acrylate, trimethylolpropane tri(meth)acrylate, pentaerythritol tri(meth)acrylate, dipentaerythritol hexa(meth)acrylate, tetraethylene glycol di(meth)acrylate, or examples in which the structure of the main chain is a propylene glycol-type with diacrylate or dimethacrylate at both ends (for example, manufactured by NOF Corp.; trade name: PDP-200, PDP-400, ADP-200, and ADP-400), tetramethylene glycol type examples (for example, manufactured by NOF Corp.; trade name: ADT-250 and ADT-850), and mixed types thereof (for example, manufactured by NOF Corp.; trade name: ADET-1800 and ADPT-4000).

In the (meth)acrylic-based adhesive resin (b) according to the present embodiment, the content of the monomer unit (b3) is preferably 0.1% by mass or more and 30% by mass or less when the total of all monomer units in the (meth)acrylic-based adhesive resin (b) is 100% by mass, more preferably 0.1% by mass or more and 15% by mass or less, even more preferably 0.1% by mass or more and 20% by mass or less, and particularly preferably 0.1% by mass or more and 5% by mass or less.

Examples of the polymerizable surfactant include a surfactant in which a polymerizable 1-propenyl group is introduced into a benzene ring of polyoxyethylene nonylphenyl ether (manufactured by Daiichi Kogyo Seiyaku Co., Ltd.; trade name: Aqualon RN-10, RN-20, RN-30, RN-50, and the like), a surfactant in which a polymerizable 1-propenyl group is introduced into a benzene ring of ammonium salt of sulfuric acid ester of polyoxyethylene nonylphenyl ether (manufactured by Daiichi Kogyo Seiyaku Co., Ltd.; trade name: Aqualon HS-10, HS-20, HS-1025, and the like), and a sulfosuccinate diester-based surfactant having a polymerizable double bond in the molecule (manufactured by Kao Corp.; trade name: Latemul S-120A, S-180A, and the like), or the like.

In the (meth)acrylic-based adhesive resin (b) according to the present embodiment, the content of the polymerizable surfactant is preferably 0.1% by mass or more and 30% by mass or less when the total of all monomer units in the (meth)acrylic-based adhesive resin (b) is 100% by mass, more preferably 0.1% by mass or more and 15% by mass or less, even more preferably 0.1% by mass or more and 20% by mass or less, and particularly preferably 0.1% by mass or more and 5% by mass or less.

The (meth)acrylic-based adhesive resin (b) according to the present embodiment may further contain a monomer unit formed of a monomer having a polymerizable double bond such as vinyl acetate, acrylonitrile, or styrene, as necessary.

Examples of the polymerization reaction mechanism of the (meth)acrylic-based adhesive resin (b) according to the present embodiment includes radical polymerization, anionic polymerization, cationic polymerization, and the like. In consideration of the manufacturing cost of the (meth)acrylic-based adhesive resin (b), the influence of functional groups of the monomer, the influence of ions on the surface of the electronic component, and the like, polymerization by radical polymerization is preferable.

When polymerizing by a radical polymerization reaction, examples of radical polymerization initiators include organic peroxides such as benzoyl peroxide, di-t-butyl peroxide, dicumyl peroxide, 3,3,5-trimethylhexanoyl peroxide, di-2-ethylhexylperoxy dicarbonate, methyl ethyl ketone peroxide, t-butylperoxyphthalate, t-butylperoxybenzoate, di-t-butylperoxyacetate, t-butylperoxyisobutyrate, t-butylperoxy-2-hexanoate, t-butylperoxy-2-ethylhexanoate, t-butylperoxy-3,5,5-trimethylhexanoate, acetyl peroxide, isobutyryl peroxide, octanoyl peroxide, t-butyl peroxide, and di-t-amyl peroxide; inorganic peroxides such as ammonium persulfate, potassium persulfate, and sodium persulfate; azo compounds such as 2,2'-azobisisobutyronitrile, 2,2'-azobis-2-methylbutyronitrile, and 4,4'-azobis-4-cyanovaleric acid.

In a case of polymerizing by an emulsion polymerization method, among these radical polymerization initiators, inorganic peroxides such as water-soluble ammonium persulfate, potassium persulfate, and sodium persulfate, and azo compounds having a carboxyl group in the molecule such as water-soluble 4,4'-azobis-4-cyanovaleric acid are preferable. Considering the influence of ions on the surface of the electronic components, ammonium persulfate and azo compounds having a carboxyl group in the molecule such as 4,4'-azobis-4-cyanovaleric acid are more preferable, and azo compounds having a carboxyl group in the molecule such as 4,4'-azobis-4-cyanovaleric acid are particularly preferable.

The adhesive resin layer (B) according to the present embodiment preferably further includes, in addition to the adhesive resin (B1), a cross-linking agent (B2) having two or more cross-linkable functional groups in one molecule.

The cross-linking agent (B2) having two or more cross-linkable functional groups in one molecule is used to react with the functional groups having the adhesive resin (B1) and adjust the adhesive force and aggregating force.

Examples of such cross-linking agents (B2) include epoxy compounds such as sorbitol polyglycidyl ether, polyglycerol polyglycidyl ether, pentaerythritol polyglycidyl ether, diglycerol polyglycidyl ether, glycerol polyglycidyl ether, neopentyl glycol diglycidyl ether, and resorcinol diglycidyl ether; isocyanate compounds such as tetramethylene diisocyanate, hexamethylene diisocyanate, toluene diisocyanate 3 adduct of trimethylolpropane, polyisocyanate, diphenylmethane diisocyanate, and tolylene diisocyanate; aziridine compounds such as trimethylolpropane tri-β-aziridinyl propionate, tetramethylolmethane-tri-β-aziridinyl propionate, N,N'-diphenylmethane-4,4'-bis(1-aziridinecarboxyamide), N,N'-hexamethylene-1,6-bis(1-aziridinecarboxyamide), N,N'-toluene 2,4-bis(1-aziridinecarboxyamide), and trimethylolpropane-tri-β-(2-methylaziridine) propionate; tetrafunctional epoxy compounds such as N,N,N',N'-tetraglycidyl-m-xylenediamine, and 1,3-bis(N,N'-diglycidylaminomethyl)cyclohexane; melamine-based compounds such as hexamethoxymethylol melamine, and the like. These may be used alone or in a combination of two or more types.

Among the above, it is preferable to include one type or two or more types selected from epoxy-based compounds, isocyanate-based compounds, and aziridine-based compounds.

Usually, the content of the cross-linking agent (B2) is preferably in a range where the number of functional groups in the cross-linking agent (B2) does not exceed the number of functional groups in the adhesive resin (B1). However, in a case where new functional groups are created in the cross-linking reaction, in a case where the cross-linking reaction is slow, and the like, the content thereof may be greater as necessary.

The content of the cross-linking agent (B2) in the adhesive resin layer (B) is preferably 0.1 parts by mass or more and 10 parts by mass or less with respect to 100 parts by mass of the adhesive resin (B1), and more preferably 0.5 parts by mass or more and 5 parts by mass or less.

The adhesive resin layer (B) according to the present embodiment preferably includes an adhesion-imparting resin in addition to the adhesive resin (B1) from the viewpoint of improving the adhesion to the support substrate. Containing an adhesion-imparting resin in the adhesive resin layer (B) is preferable for facilitating adjustment of the adhesion to the support substrate near room temperature. An adhesion-imparting resin in which the softening point is 100° C. or higher is preferable. Specific examples of adhesion-imparting resins include rosin-based resins such as rosin-based derivatives treated by esterification or the like; terpene-based resins such as α-pinene, β-pinene, dipentene, and terpene phenol; natural rosins such as gum, wood, and tall oil; petroleum resins hydrogenated, disproportionated, polymerized, or maleated with these natural rosins; coumaron-indene resins, and the like.

Among these, examples having a softening point in the range of equal to or more than 100° C. and equal to or less than 160° C. are more preferable and examples having a softening point in the range of equal to or more than 120° C. and equal to or less than 150° C. are particularly preferable. Using an adhesion-imparting resin with a softening point within the above range not only minimizes contamination and glue residue on the support substrate, but also further improves adhesion to the support substrate in a working environment. Furthermore, when a polymerized rosin ester-based adhesion-imparting resin is used as the adhesion-imparting resin, not only are contamination and glue residue on the support substrate minimized, but also adhesion to the support substrate in an environment of equal to or more than 80° C. and equal to or less than 130° C. is improved, and in a case of a heat-expandable adhesive including heat-expandable microspheres, it is possible to more easily carry out the peeling from the support substrate after expansion of the heat-expandable microspheres.

The blending ratio of the adhesion-imparting resin may be appropriately selected such that it is possible to adjust the elastic modulus of the adhesive resin layer (B) within a predetermined numerical range as desired, without being particularly limited. However, in terms of the elastic modulus of the adhesive resin layer (B) and the initial peeling force, 1 to 100 parts by mass with respect to 100 parts by mass of the adhesive resin (B1) is preferable. When the blending ratio of the adhesion-imparting resin is the lower limit value described above or more with respect to 100 parts by mass of the adhesive resin (B1), there is a tendency for the adhesion to the support substrate during work to be favorable.

On the other hand, when the blending ratio is the upper limit value described above or less, there is a tendency for the attachment property to the support substrate at room temperature to be favorable. In terms of the adhesion with the support substrate and the attachment property at room temperature, the blending ratio of the adhesion-imparting resin is preferably 2 to 50 parts by mass with respect to 100 parts by mass of the adhesive resin (B1). In addition, the acid value of the adhesion-imparting resin is preferably 30 or less. When the acid value of the adhesion-imparting resin is the upper limit value described above or less, there is a tendency for it to be difficult for glue residue to be left on the support substrate during peeling.

The adhesive resin layer (B) may include additives such as plasticizers as other components. When the entire adhesive resin layer (B) is 100% by mass, the total content of the adhesive resin (B1), the cross-linking agent (B2), and the adhesion-imparting resin in the adhesive resin layer (B) is preferably 50% by mass or more, more preferably 70% by mass or more, even more preferably 90% by mass or more, and particularly preferably 95% by mass or more. Furthermore, in a case where the adhesive resin layer (B) is formed of a heat-expandable adhesive, when the entire adhesive resin layer (B) is 100% by mass, the total content of the adhesive resin (B1), the cross-linking agent (B2), the adhesion-imparting resin, the gas generating component, and the heat-expandable microspheres in the adhesive resin layer (B) is preferably 50% by mass or more, more preferably 70% by mass or more, even more preferably 90% by mass or more, and particularly preferably 95% by mass or more.

The thickness of the adhesive resin layer (B) is not particularly limited, but, for example, is preferably 5 µm or more and 300 µm or less, and more preferably 20 µm or more and 150 µm or less.

It is possible to form the adhesive resin layer (B), for example, by a method of coating an adhesive coating solution on the base material layer 10, a method of transferring the adhesive resin layer (B) formed on a separator onto the base material layer 10, or the like.

As a method for coating the adhesive coating solution, it is possible to adopt a coating method known in the related art, for example, a roll coater method, a reverse roll coater method, a gravure roll method, a bar coating method, a comma coater method, a die coater method, or the like. The drying conditions of the coated adhesive are not particularly limited, but in general, it is preferable to perform the drying in a temperature range of equal to or more than 80° C. and equal to or less than 200° C. for 10 seconds to 10 minutes. More preferably, drying is performed at equal to or more than 80° C. and equal to or less than 170° C. for 15 seconds to 5 minutes. In order to sufficiently promote the cross-linking reaction between the cross-linking agent and the adhesive, after the drying of the adhesive coating solution is completed, heating may be carried out at equal to or more than 40° C. and equal to or less than 80° C. for approximately 5 to 300 hours.

In addition, the base material layer 10 and the adhesive resin layer (B) may be formed by co-extrusion molding or the film-like base material layer 10 and the film-like adhesive resin layer (B) may be formed by laminating.

<Other Layers>

The adhesive film 50 according to the present embodiment may be further provided with, for example, an unevenness-absorbing layer, a shock-absorbing layer, an easy-adhesive layer, or the like between the base material layer 10 and the adhesive resin layer (A) or between the base material layer 10 and the adhesive resin layer (B), in a range in which the effects of the present embodiment are not impaired.

The unevenness-absorbing layer is preferably formed by natural rubber, synthetic rubber, or a synthetic resin having rubber elasticity with a Shore D-type hardness of, for example, 50 or less, preferably 40 or less, according to ASTM D-2240 D-type Shore. The thickness of the unevenness-absorbing layer is, for example, 500 µm or less, preferably 5 to 300 µm, more preferably 10 to 150 µm.

Examples of synthetic rubbers or synthetic resins include synthetic rubbers such as nitrile, diene, and acrylic rubbers, thermoplastic elastomers such as polyolefin and polyester elastomers, and synthetic resins having rubber elasticity such as ethylene vinyl acetate copolymers, polyurethane, polybutadiene, and soft polyvinyl chloride. In the present embodiment, it is possible to use even polymers which are essentially rigid, such as polyvinyl chloride, when combined with a blending agent such as a plasticizer or a softener to provide rubber elasticity. In addition, it is also possible to preferably use the adhesive resins and the like listed in the adhesive resin layer (A) and adhesive resin layer (B) above to form the unevenness-absorbing layer.

2. Method for Manufacturing Electronic Device

Figure 2:
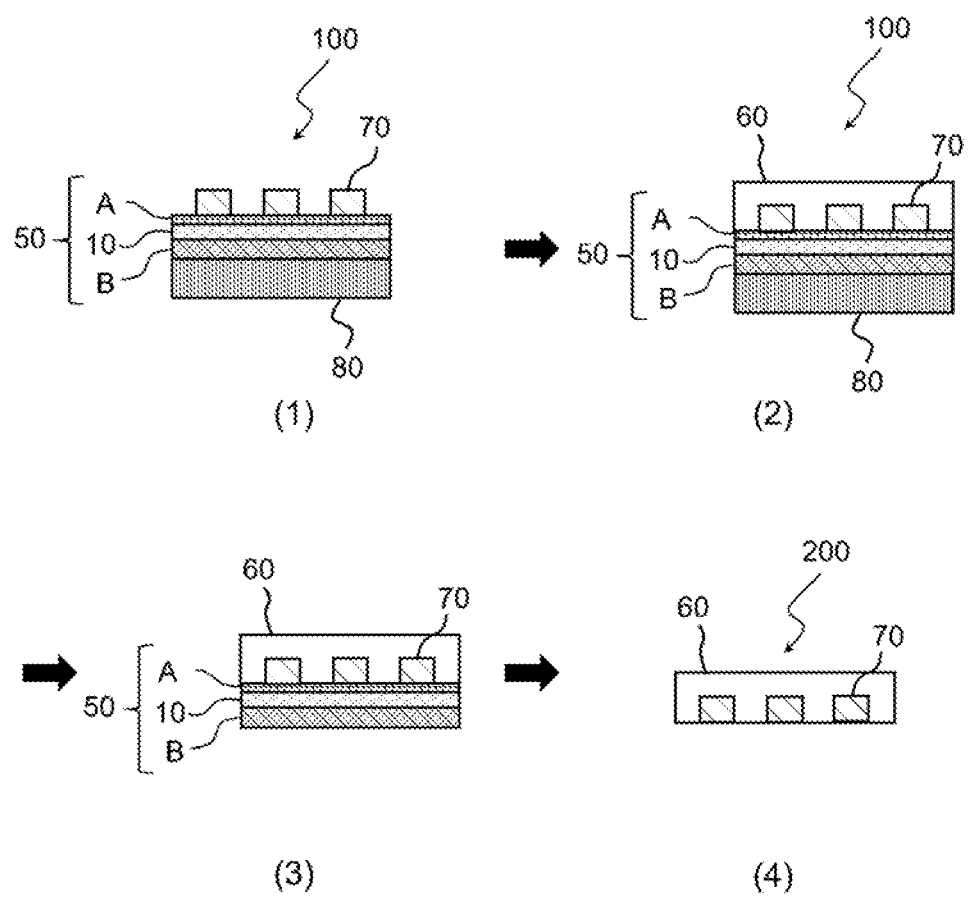
FIG. 2 is a cross-sectional view schematically showing an example of a method for manufacturing an electronic device of an embodiment according to the present invention.
Figure 3:
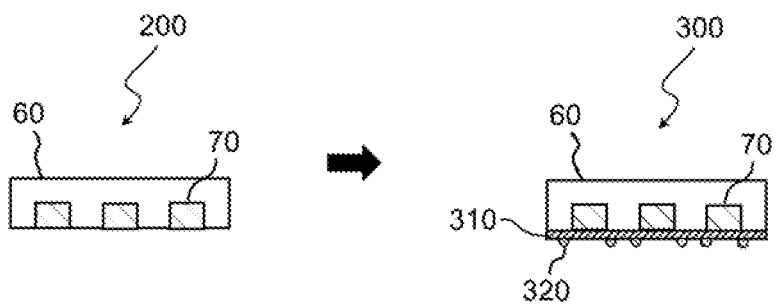
FIG. 3 is a cross-sectional view schematically showing an example of a method for manufacturing an electronic device of an embodiment according to the present invention.
Figure 3:
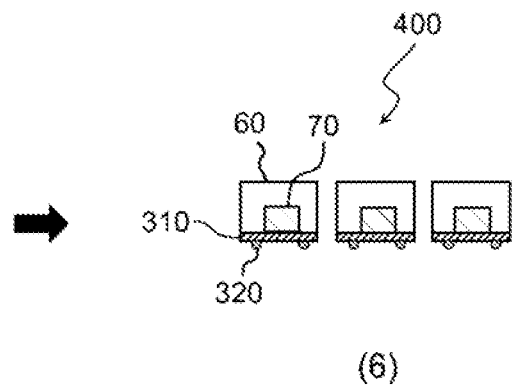

Next, a description will be given of the method for manufacturing an electronic device according to the present embodiment. FIG. 2 and FIG. 3 are cross-sectional views schematically showing an example of a method for manufacturing an electronic device of an embodiment according to the present invention.

The method for manufacturing an electronic device according to the present embodiment contains at least the following four steps.

(1) A step of preparing a structure 100 comprising the adhesive film 50, an electronic component 70 attached to the adhesive resin layer (A) of the adhesive film 50, and the support substrate 80 attached to the adhesive resin layer (B) of the adhesive film 50

(2) A step of sealing the electronic component 70 with a sealing material 60

(3) A step of peeling the support substrate 80 from the structure 100 by reducing the adhesive force of the adhesive resin layer (B) by applying an external stimulus (4) A step of peeling the adhesive film 50 from the electronic component 70

In the method for manufacturing an electronic device according to the present embodiment, the adhesive film 50 according to the present embodiment described above is used as an adhesive film for temporarily fixing the electronic component 70.

A description will be given below of each step of the method for manufacturing an electronic device according to the present embodiment.

(Step (1))

First, the structure 100 having the adhesive film 50, the electronic component 70 attached to the adhesive resin layer (A) of the adhesive film 50, and the support substrate 80 attached to the adhesive resin layer (B) of the adhesive film 50 is prepared.

It is possible to manufacture the structure 100, for example, by the following procedure.

First, on the support substrate 80, the adhesive film 50 is attached such that the adhesive resin layer (B) is on the support substrate 80 side. A protective film called a separator may be attached on the adhesive resin layer (B) and it is possible to peel the protective film and to attach the exposed surface of the adhesive resin layer (B) to the surface of the support substrate 80.

As the support substrate 80, for example, it is possible to use a quartz substrate, a glass substrate, a SUS substrate, or the like.

Next, it is possible to obtain the structure 100 by arranging the electronic components 70 on the adhesive resin layer (A) of the adhesive film 50 attached on the support substrate 80. A protective film called a separator may also be attached on the adhesive resin layer (A) and, in such a case, the electronic components are arranged after the protective film is peeled.

Examples of the electronic components 70 include semiconductor chips such as IC, LSI, discrete chips, light emitting diodes, and light receiving elements, semiconductor panels, semiconductor packages, and the like.

(Step (2))

Next, the electronic component 70 is sealed with the sealing material 60.

The electronic component 70 is covered by the sealing material 60, and for example, in a case where the adhesive layer resin layer (B) is a heat-peelable type adhesive resin layer, the sealing material 60 is cured at a temperature at which there is no peeling from the support substrate 80, for example, at a temperature of 150° C. or lower, to seal the electronic component 70.

In addition, the form of the sealing material 60 is not particularly limited, but is, for example, granular, sheet form, or liquid form.

The sealing material 60 is not particularly limited, but for example, it is possible to use an epoxy resin-based sealing material using an epoxy resin.

In particular, a liquid epoxy resin-based sealing material is preferable in terms of the affinity of the sealing material 60 to the adhesive film 50 being further improved and being able to seal the electronic components 70 more evenly.

As such epoxy resin-based sealing material, for example, it is possible to use the T693/R4000 series, the T693/R1000 series, the T693/R5000 series, and the like manufactured by Nagase ChemteX Corporation.

Examples of sealing methods includes transfer molding, injection molding, compression molding, casting molding, and the like. After sealing the electronic component 70 with the sealing material 60, the sealing material 60 is cured by heating at, for example, a temperature of 150° C. or lower and the structure 100 in which the electronic component 70 is sealed is obtained.

(Step (3))

Next, the support substrate 80 is peeled from the structure 100 by reducing the adhesive force of the adhesive resin layer (B) by applying an external stimulus.

After sealing the electronic component 70, it is possible to easily remove the support substrate 80 from the adhesive film 50 by heating to a temperature at which the adhesive force is reduced or lost, for example, a temperature exceeding 150° C. to reduce the adhesive force of the adhesive resin layer (B).

(Step (4))

Next, the adhesive film 50 is removed from the electronic component 70 to obtain the electronic device 200. Examples of methods for removing the adhesive film 50 from the electronic component 70 include a mechanical peeling method, a method of carrying out peeling after reducing the adhesive force of the adhesive film 50 surface, and the like.

(Step (5))

In the method for manufacturing an electronic device according to the present embodiment, as shown in FIG. 3, a step (5) of forming a wiring layer 310 and bumps 320 on the exposed surface of the obtained electronic device 200 to obtain an electronic device 300 may be further provided.

The wiring layer 310 is provided with pads (not shown), which are external connection terminals formed on the outermost surface, and wiring (not shown), which electrically connects the exposed electronic component 70 to the pads. The wiring layer 310 is able to be formed by methods known in the related art and may be a multilayer structure.

Then, it is possible to form the bumps 320 on the pads of the wiring layer 310 and obtain the electronic device 300. Examples of the bumps 320 include solder bumps, gold bumps, or the like. It is possible to form solder bumps, for example, by arranging a solder ball on the pad, which is an external connection terminal of the wiring layer 310, and heating and melting (reflowing) the solder. It is possible to form gold bumps by methods such as a ball bonding method, a plating method, and an Au ball transfer method.

(Step (6))

In addition, in the method for manufacturing an electronic device according to the present embodiment, as shown in FIG. 3, a step (6) of dicing the electronic device 300 to obtain a plurality of electronic devices 400 may be further provided.

It is possible to perform the dicing of the electronic device 300 by a known method.

A description was given above of the embodiments of the present invention, but these are examples of the present invention and it is also possible to adopt various configurations other than the above.

Here, the present invention is not limited to the embodiments described above and modifications, improvements, and the like in a range in which it is possible to achieve the object of the present invention are included in the present invention.

EXAMPLES

A specific description will be given below of the present invention by means of Examples below, but the present invention is not limited thereto.

The details of the materials used to manufacture the adhesive film are as follows.

Example 1

(i) An adhesive film having an adhesive resin layer (A) with a thickness of 13 μm having a (meth)acrylic adhesive resin as a main constituent component, a storage modulus E' at 125° C. of $2.2 \times 10^6$ Pa, and a glass transition temperature (Tg) of −14° C., a base material layer with a thickness of 38 μm formed of polyethylene terephthalate (PET) film, an easy-to-bond layer with a thickness of 22 μm formed of an acrylic-based resin, and a heat-expandable adhesive layer (adhesive resin layer (B)) with a thickness of 28 μm which has a characteristic of peeling at 185° C., in this order, was prepared.

(ii) The prepared adhesive film was adhered to a stainless-steel plate (φ10 mm, 1.5 mm thick) for compression molding through the adhesive resin layer (B) side.

(iii) Next, on the adhesive resin layer (A) of the adhesive film, 5.0 mm square semiconductor chips with a thickness of 250 μm, which were electronic components, were chip-mounted in a grid pattern with 2.0 mm intervals, using a flip chip bonder, with the head temperature and stage temperature set at 25° C., a pressing pressure of 10 N, and a pressing time of 0.5 s to carry out adhesion.

(iv) Resin sealing of the plurality of semiconductor chips on the adhesive resin layer (A) was performed using a molding machine with a liquid epoxy resin-based sealing material (manufactured by Nagase ChemteX Corporation, product name: T693/R4212-2C) at a pressure of 280 kN, a molding temperature of 125° C., and a molding time of 400 s. Due to this, a structure in which an electronic device with a thickness of 550 μm and φ300 mm was formed on a stainless-steel plate through an adhesive film was obtained.

(v) The obtained structure was placed into an oven and heated at 150° C. for 30 minutes to further cure the epoxy resin-based sealing material.

(vi) Thereafter, the structure was heat-pressed at 190° C. for 1 minute to heat and expand the adhesive resin layer (B) and the adhesive resin layer (B) and the stainless-steel plate were peeled.

(vii) Next, the adhesive film was removed by peeling the adhesive resin layer (A) from the electronic device at 150° C. to obtain the electronic device.

(viii) The obtained electronic devices were each evaluated for "Position Shifting of Electronic Components in Sealing Step" and "Glue Residue on Electronic Components". The obtained results are shown in Table 1.

Examples 2 to 4 and Comparative Examples 1 and 2

Electronic devices were each manufactured by the same method as in Example 1 using the same adhesive film as the adhesive film used in Example 1, except that the storage modulus E' at 125° C. and Tg of the adhesive resin layer (A) were changed to the values shown in Table 1.

The obtained electronic devices were evaluated in the same manner as in Example 1. The obtained results are shown in Table 1.

<Evaluation>

(1) Position Shifting of Electronic Components in Sealing Step

The electronic devices obtained in the Examples and Comparative Examples were evaluated for position shifting of electronic components using the following criteria.

Good: Position Shifting of the semiconductor chip was not observed.

Bad: Position shifting was observed in at least a part of the semiconductor chips.

(2) Glue Residue on Electronic Components

For the electronic devices obtained in the Examples and Comparative Examples, the surface of the semiconductor chip after the adhesive film was peeled was observed under an optical microscope at 200× and 500×, glue residue of the adhesive film on the surface of the semiconductor chip was confirmed, and the glue residue of the adhesive film was evaluated using the following criteria.

Good: Glue residue was not observed on the peeling surface of the semiconductor chip side Bad: Glue residue was observed on the peeling surface of the semiconductor chip side <Method for Measuring Storage Modulus E' at 125° C. of Adhesive Resin Layer (A) Used in Examples and Comparative Examples>

For the adhesive resin layers (A) used in the Examples and Comparative Examples, 20 μm adhesive resin layers were prepared separately from the adhesive film, respectively. After that, the obtained adhesive resin layers were laminated and samples for viscoelasticity measurement with a thickness of 1 mm were obtained respectively.

For the obtained samples for viscoelasticity measurement, the solid viscoelasticity was measured using a solid-state viscoelasticity measurement device (RSA-3, manufactured by TA Instruments) under conditions of a frequency of 1 Hz, a temperature rise rate of 5° C./min, a strain of 0.05%, a distance between chucks of 20 mm, and a sample width of 10 mm, and the measurement results were analyzed and used as the storage modulus E' at 125° C. of the adhesive resin layer (A). In addition, the peak temperature of the measured tan δ was used as Tg.

TABLE 1

|  | Storage modulus E' at 125° C. of adhesive resin layer (A) [Pa] | Tg of adhesive resin layer (A) [° C.] | Position shifting of electronic components | Glue residue |
|---|---|---|---|---|
| Example 1 | $2.2 \times 10^6$ | −14 | Good | Good |
| Example 2 | $1.3 \times 10^6$ | −4 | Good | Good |
| Example 3 | $1.1 \times 10^6$ | −5 | Good | Good |
| Example 4 | $0.7 \times 10^6$ | −4 | Good | Good |
| Comparative Example 1 | $4.7 \times 10^6$ | −9 | Bad | Good |
| Comparative Example 2 | $0.1 \times 10^6$ | −15 | Good | Bad |

In the Examples using an adhesive film in which the storage modulus E' at 125° C. of the adhesive resin layer (A) was $0.2 \times 10^6$ Pa or more and $4.5 \times 10^6$ Pa or less, position shifting of the electronic components in the sealing step and glue residue on the electronic components were not observed. Thus, it is understood that, in the method for manufacturing an electronic device in the Examples, it is possible to suppress the position shifting of the electronic component in the sealing step and also suppress glue residue on the electronic component side when the electronic component is peeled from the adhesive film.

In contrast, in Comparative Example 1, in which an adhesive film was used in which the storage modulus E' at 125° C. of the adhesive resin layer (A) exceeded $4.5 \times 10^6$ Pa, position shifting of the electronic components in the sealing step was observed. In addition, in Comparative Example 2, in which an adhesive film was used in which the storage modulus E' at 125° C. of the adhesive resin layer (A) was less than $0.2 \times 10^6$ Pa, glue residue on the electronic components was observed.

This application claims priority based on Japanese application JP 2019-103469 filed on Jun. 3, 2019, the entire disclosure of which is incorporated herein.

REFERENCE SIGNS LIST

A: Adhesive resin layer
B: Adhesive resin layer
10: Base material layer
10A: First surface
10B: Second surface
50: Adhesive film
60: Sealing material
70: Electronic component
80: Support substrate
100: Structure
200: Electronic device
300: Electronic device
310: Wiring layer
320: Bump
400: Electronic device

The invention claimed is:

1. A method for manufacturing an electronic device, the method comprising at least:
a step (1) of preparing a structure comprising
an adhesive film provided with a base material layer, an adhesive resin layer (A) provided on a first surface side of the base material layer, and an adhesive resin layer (B) provided on a second surface side of the base material layer and in which an adhesive force is reduced by an external stimulus, in which a storage modulus E' at 125° C. of the adhesive resin layer (A) is $0.2 \times 10^6$ Pa or more and $4.5 \times 10^6$ Pa or less, an electronic component attached to the adhesive resin layer (A) of the adhesive film, and a support substrate attached to the adhesive resin layer (B) of the adhesive film;

a step (2) of sealing the electronic component with a sealing material;

a step (3) of peeling the support substrate from the structure by reducing an adhesive force of the adhesive resin layer (B) by applying an external stimulus; and a step (4) of peeling the adhesive film from the electronic component, wherein the adhesive resin layer (A) includes a (meth) acrylic-based adhesive resin, wherein the adhesive resin layer (A) further includes a cross-linking agent (A2) having two or more cross-linkable functional groups in one molecule, and wherein the total content of the (meth)acrylic-based adhesive resin and the cross-linking agent (A2) in the adhesive resin layer (A) is 70% by mass or more when the entire adhesive resin layer (A) is 100% by mass.

2. The method for manufacturing an electronic device according to claim 1, wherein the adhesive resin layer (B) is an adhesive film in which an adhesive force is reduced by heating at a temperature exceeding 150° C., and the step (3) includes heating at a temperature exceeding 150° C.

3. The method for manufacturing an electronic device according to claim 1, wherein the adhesive resin layer (B) includes at least one selected from gas generating components and thermally expandable microspheres.

4. The method for manufacturing an electronic device according to claim 1, wherein the sealing material is an epoxy resin-based sealing material.

* * * * *